United States Patent [19]

Braginski et al.

[11] Patent Number: 4,575,927
[45] Date of Patent: Mar. 18, 1986

[54] SUBMICRON-PARTICLE DUCTILE SUPERCONDUCTOR

[75] Inventors: Aleksander I. Braginski, Pittsburgh; Alan T. Male, Murrysville, both of Pa.

[73] Assignee: Westinghouse Electric Corp., Pittsburgh, Pa.

[21] Appl. No.: 518,597

[22] Filed: Jul. 29, 1983

Related U.S. Application Data

[62] Division of Ser. No. 293,537, Aug. 17, 1981, Pat. No. 4,411,959.

[51] Int. Cl.⁴ .................... H01L 39/12; H01L 39/24
[52] U.S. Cl. ...................... 29/599; 148/11.5 P; 148/126.1; 174/126 S
[58] Field of Search ............ 29/599; 148/11.5 P, 148/126.1, 133; 174/126 S

[56] References Cited

U.S. PATENT DOCUMENTS 4,050,147 9/1977 Winter .................... 75/0.5 BB
4,419,125 12/1983 Charles et al. .................... 29/599

FOREIGN PATENT DOCUMENTS 22592 8/1979 Japan .................... 29/599

Primary Examiner—Howard N. Goldberg
Assistant Examiner—Vernon K. Rising
Attorney, Agent, or Firm—R. A. Stoltz

[57] ABSTRACT

A submicron-particle ductile superconductor and method of fabricating the same wherein the submicron particles (e.g., 300 Angstroms) of a superconductor (e.g., NbC) are encapsulated in a metal tube (e.g., copper) and then fabricated down to fine wire in the absence of sintering of reaction annealing. Because of the fluid-like properties of the unsintered submicron-particle powdered core, the composite fabricated wire retains ductility and resistance to fracture while exhibiting superconducting properties approaching those of the bulk material in the core. Multifilamentary composites are obtained by bundling and fabricating the bundle down in a required number of steps.

11 Claims, 9 Drawing Figures

SUBMICRON-PARTICLE DUCTILE SUPERCONDUCTOR

This is a division of application Ser. No. 293,537, filed Aug. 17, 1981, now U.S. Pat. No. 4,411,959.

BACKGROUND OF THE INVENTION

1. Field of the Invention:

This invention relates to a superconducting composite wire that retains ductility and resistance to fracture after fabrication. More specifically, the invention relates to a conducting metal-sheathed composite wire with submicron-particle superconducting powder core or filaments and a method for making the same.

2. Description of the Prior Art:

The general concept of making a composite wire by filling a tube or sheath made from a ductile metal, sealing the ends and then fabricating a wire having an encapsulated core is well recognized and documented in the literature and has been employed historically for a variety of purposes. For example, in U.S. Pat. No. 2,888,740 a special end use welding rod is produced by such a method by filling a tube or sheath of a ductile metal before fabrication with a preselected amount of core composition that results in a hard non-ductile alloy melt post welding. Similarly, various alternative methods of fabrication have been previously suggested and employed with varying degrees of success. Thus, for example, U.S. Pat. No. 3,922,769 describes a particularly useful technique of hydrostatically extruding a composite billet into a wire at elevated temperatures and very high pressures.

Application of the general concept of making composite wire, wherein the wire is intended to be used as a superconductor, has been far more limited in that it has been directed towards a specific approach to solving specific problems. As is known, superconductivity of metallic materials, i.e., the disappearance of the electrical resistance in the range of low temperatures, particularly near absolute zero, is not limited to specific pure metals or to alloys of two superconductors. Alloys of a normal conducting material and a superconducting material and alloys of two normal conducting materials show superconductivity as well. Intermetallic compounds have gained particular importance as superconductors since their transition temperatures markedly exceed those of pure components and alloys. In U.S. Pat. No. 3,256,118 the problems associated with the manufacture of superconducting wires of intermetallic compounds is expressly described as being due to the brittleness of these compounds. In this patent a method of manufacturing a superconducting wire is disclosed wherein a tube of one component is densely filled with a similar wire bundle and voids are filled with a second reactant of the intermetallic compound before this ductile composite is fabricated into a wire. Thereafter the superconducting intermetallic compound is produced, in situ, by reaction annealing the wire for several hours at high temperatures. Unfortunately, the ductility associated with the reactant composite is destroyed during the reaction annealing and formation of the superconducting structure.

Similarly, in U.S. Pat. No. 3,496,622 a sheath made of one component and filled with a powder mixture of the same component and the other reactant of a superconductor. This assembly is first fabricated into a wire and then reaction annealed, to promote the reaction forming the superconducting compound, but again resulting in a non-ductile wire. In U.S. Pat. No. 3,954,572 a multiple step reaction/diffusion process is disclosed wherein a composite ductile wire made up of a core and a jacket is first fabricated into wire and then an alloy sheath is applied to the composite wire, followed by heat treating to induce diffusion and reaction alternately, producing a non-ductile superconducting wire.

In U.S. Pat. No. 4,050,147 a fundamentally distinct technical approach to fabricating a composite superconducting wire is suggested. An ultrafine powdered superconductor is uniformly mixed with an equal or greater volume of a similarly powdered conducting metal such that the discrete superconducting particles are not in contact with each other. The blend is then encapsulated in a normal conducting tube or sheath. After fabrication into a wire the composite retains some ductility since a major part of the core consists of a ductile metal. The observed superconducting properties of the wire are characteristic of the superconducting powder dispersed in the normal conducting matrix. In this case the superconductivity is mediated by the, so-called, proximity effect. Contrary to the assertions of this patent the proximity effect is weak when the concentration of ductile metal is high. Consequently, superconducting properties of the wire are also weak and of limited practical interest.

SUMMARY OF THE INVENTION

In view of the problems associated with previous known methods of manufacturing superconducting composite wire, we have discovered a superconducting composite wire which is ductile and retains fracture resistance during subsequent use as well as discovered a method of fabricating such a wire. The superconducting composite wire of our invention comprises:

(a) an encapsulating sheath of ductile, normal conducting metal; and (b) an encapsulated essentially contiguous core or filaments of submicron-particle superconducting powder.

The invention provides for the submicron-particle superconducting powder to involve particle sizes, smaller than 1000 Angstroms and preferably in the range of 100 Angstroms. The method of the present invention comprises the steps of:

(a) encapsulating a submicron-particle superconducting powder in ductile normal conducting metal tube; and (b) fabricating a wire from said tube(s) to obtain a single core of multifilamentary composite.

The superconducting composite wire and the method for making a ductile superconducting composite involves, in the broadest sense, using any superconducting material that can be synthesized in the form of submicron powder. The method further refrains from sintering or reaction annealing the resulting wire, thus avoiding the problems associated with the formation of a brittle core or filaments.

DESCRIPTION OF THE PREFERRED EMBODIMENTS

Figure 1:
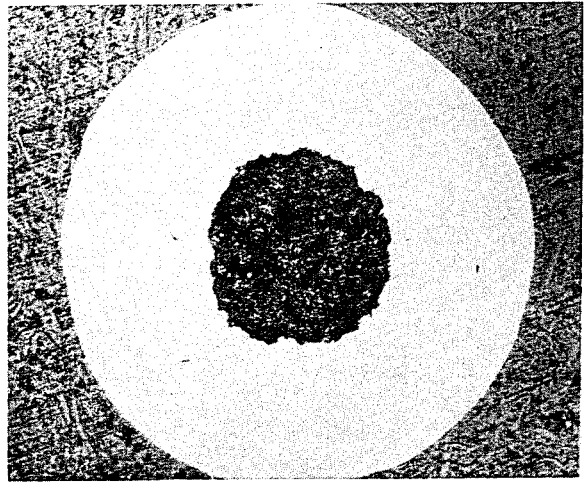
FIG. 1 shows an optical microscope photograph of a 0.25 mm diameter NbC/Cu composite wire cross-section under X336 magnification.

The submicron-particle or micro-powder employed as the core of the composite wire can be selected from any superconducting material that can be synthesized in the form of ultrafine powder. Preferably the superconducting material should be a so-called high field superconductor that exhibits high values of the upper critical field ($H_{c2}$), transition temperature ($T_c$) and critical current density ($j_c$). These materials and in particular the high-$T_c$ superconductors consisting of two elements of the type A$_3$B, having an A15 crystal structure, are known to be extremely hard and brittle. Included in this group are the intermetallic compounds of the metals niobium or vanadium with other elements including such compounds as: Nb$_3$Sn, Nb$_3$Al, Nb$_3$Ga, Nb$_3$Ge, V$_3$Si, and V$_3$Ga. The ternary (pseudobinary) A15 intermetallic compounds such as niobiumaluminum-germanium, Nb$_3$(Al, Ge), and the B1 crystal structure high-field niobium nitride, NbN, and niobium carbonitride, Nb(N, C); e.g., NbN$_{1-x}$C$_x$ for x≈0.3, and Chevrel phases such as PbMo$_6$S$_8$ are also preferred compositions. As will be exemplified herein, even the moderately high-$T_c$ compound niobium carbide, NbC, is useful as it demonstrates the principle of the present invention.

The particle size of the powdered superconducting composition should be submicron, thus exhibiting and imparting fluid-like characteristics to the core of the composite wire. The average particle dimension should be below 1000 Angstroms and preferably with significant contribution from the 100 Angstrom sizes. Advantageously the particles are to be smooth and preferably spherical to ensure an effective ductility during fabrication, and compactness and high aggregate density after fabrication into a wire. The spherical particle diameter, $\phi$, preferably is to exceed the Ginzburg-Landau coherence lengths, $\xi_{GL}$, to avoid any significant degradation of $T_c$. The spacing between adjacent particles is to be much less than $\xi_{GL}$ to ensure strong coupling while the diameter of voids between dense-packed spheres should be comparable to $\xi_{GL}$ in order to ensure maximum flux pinning; i.e., preferably the spherical particles are to be essentially contiguous. It should be noted that for the superconducting particles to be essentially contiguous, any additives (such as a lubricant) should be less than about 10% by volume.

Various methods can be used to synthesize the desired submicron powder superconductor including but not limited to micrometallurgical techniques, highly dispersed precipitation and various arc-plasma reactions. One particularly useful method involving a hydrogen plasma reaction is described in U.S. Pat. No. 4,050,147 and is incorporated herein by reference as being descriptive of synthesis of the submicron superconducting powder.

This submicron superconducting powder to be used as the core is then placed in a metal tube or sheath of selected dimensions characteristic of the desired proportions of the resulting fabricated composite wire. The metal used can be essentially any ductile non-magnetic wire-forming metal known in the art and includes but is not limited to Cu, Al, Nb, Ta, Ag, or Au, mixtures thereof and the like. Preferably copper is used.

Next the ends of the tube or sheath are sealed. Optionally this filling and sealing of the tube can be performed in a protective gaseous atmosphere of hydrogen, argon or other inert gas or in a vacuum. Then the tube or sheath filled with the submicron superconducting powder is fabricated into a wire. This wire can then be bundled and fabricated into a multifilamentary wire with the number of bundling and fabricating sequences determined by the specified number of filaments in the composite.

The method of fabrication can again be essentially any known method in the art and includes such techniques as extrusion, hydrostatic extrusion, swaging, drawing, rolling, hammering or combinations thereof. One particularly useful and the preferred method of fabrication is the hydrostatic extrusion process as described in U.S. Pat. No. 3,922,769 also herein incorporated by reference as being descriptive of wire fabrication except that no high temperature reaction annealing or sintering is employed. This lack of sintering or reaction annealing is critical in that high temperatures promote metallurgical bond formation particularly across the ultrafine-grained particle boundaries resulting in the loss of ductility and resistance to core fracture of the final composite wire.

It has been observed during the fabrication process, wherein successive reductions in the cross-section of the wire take place, that the density of the core approaches the theoretical hexagonal close-packed (HCP) density for uniform spheres. This observation supports the view that the resulting fabricated composite wire involves a submicron-particle core(s) of nearly contiguous spherical particles capable of slipping under stress relative to each other such as to maintain contact or close proximity yet simultaneously exhibit effective aggregate ductility. The advantages of retaining ductility in the final composite wire is straightforward in that a ductile wire can be bent to a useful shape after fabrication or otherwise strained while a brittle wire breaks or loses its superconductivity. It has been further observed, as is exemplified herein, that the composite wires of the present invention retain a significant percentage of their superconductivity even after large (greater than 1%) bending strains which is superior and distinguishable from composite superconducting wires previously known.

In manufacturing composite wire in accordance with the disclosed process, the wire can be a single filament composite or a multiple filament structure. The use of the multiple filaments is preferred in practical applications. Multiple filament composite wires with as many as 49 filament strands have been successfully produced and tested. Optionally, the manufacturing of the composite wire can involve the use of low concentrations less than about 10% and preferably about 1% or less by volume of a lubricant coating or ultrafine lubricant powder such as graphite, molybdenum disulfide, copper, tin, silver and the like.

EXAMPLES

Figure 2:
FIG. 2 shows a scanning electron microscope photograph of the appearance of a NbC/Cu composite wire fracture during wire drawing under X33 magnification.

A commercially available niobium carbide powder, NbC, obtained from Hermann C. Starck, Berlin, West Germany, generated by arc-plasma, having a mean particle size of about 300 Angstroms (±200 Angstroms), a superconducting transition onset at approximately 11° K. (i.e., critical temperature $T_c \simeq 11°$ K.), an upper critical field $H_{c2} > 15$ kG at 4.2° K., and contaminated by approximately 5,000 ppm Cr, 300 ppm Ni, 200 ppm Fe and about 1 wt. % free carbon (graphite) which serves as a lubricant, was packed into oxygen free high conductivity (OFHC) copper tubes of 6.35 mm and 9.53 mm outer diameter, plugged with copper plugs and seal welded. The initial density of the compacted powder was 0.8 gm cm$^{-3}$ or approximately 10 percent of the bulk NbC density. The tubes were cold swaged and drawn (at room temperature) without intermediate annealings down to 0.25 mm diameter. The wire was flexible and ductile. A cross-section of this wire is shown in FIG. 1. The powder densification was monitored down to 0.95 mm diameter where the density was approximately 80% of the hexagonal close packing (HCP) theoretical density. Fractures of the composite wire produced necks characteristic of ductile material as shown in the scanning electron microscope photograph of FIG. 2. The mechanical behavior of the NbC/Cu composite is thus clearly typical of a ductile material.

The critical temperature of the 0.94 mm and 0.36 mm OD wires was $T_c \simeq 10°$ K. and 9° K., respectively; the transition width was approximately 1° K. The self-field critical current density in the superconductor was $j_c \simeq 5 \times 10^3$ A cm$^{-2}$ at 4.2° K. The upper critical field determined from the $j_c(H)$ dependence was $H_{c2} > 10$ kilogauss at 4.2° K.

The above results prove that a ductile wire made of discrete particles, i.e., without sintering, can behave as a continuous (homogeneous) superconductor if the powder is sufficiently densified. A strenuous bending test consisting of winding and unwinding the 0.36 mm wire on a 3.175 mm radius mandrel caused a degradation of $j_c$ by 77% at a strain $\epsilon \simeq 2.8\%$. This degradation is thought to result from partial decompression of the powder due to the copper tube deformation. In a realistic multifilamentary composite this effect should not occur.

Uniformity of core cross-section of a NbC/Cu composite wire drawn to 0.25 mm diameter was determined by sectioning at random an approximately 150 cm length of the composite wire and measuring optically, in 38 micrographic sections, the core diameter. The average core diameter was 125 μm with a standard deviation of 27 μm and maximum deviations of −44 and +55 μm. Although the average diameter measurement was probably too high and the deviations exaggerated due to smearing of the NbC powder during the polishing process, the continuity of the core and the relative uniformity of diameter were demonstrated.

Figure 3A:
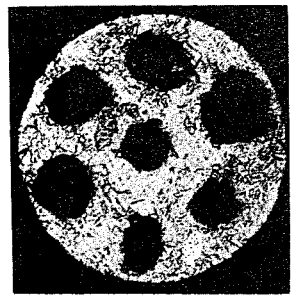
FIGS. 3A and 3B and 4A and 4B show optical microscope photographs of 7 and 49 filament composite cross-sections under X200 magnification.
Figure 3B:
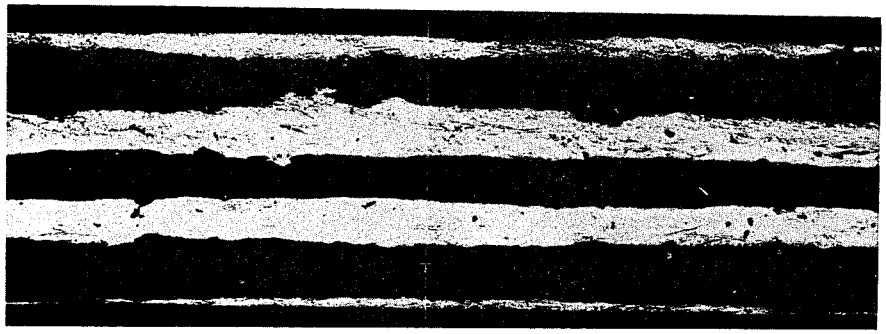
Figure 4A:
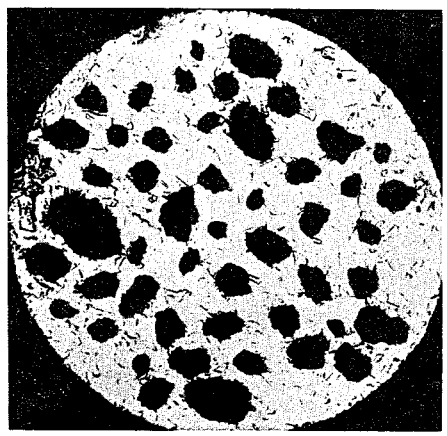
Figure 4B:
Figure 5:
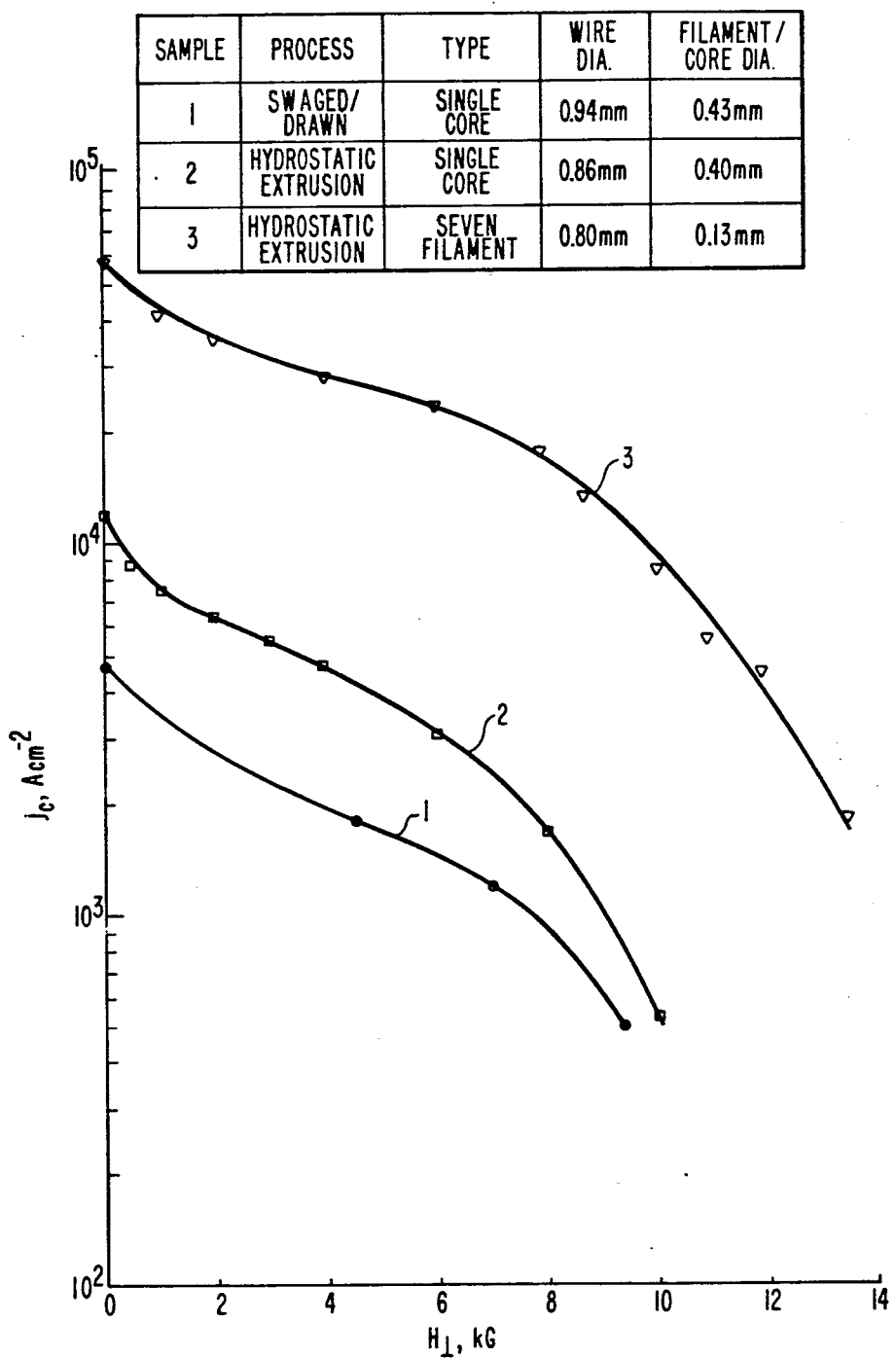
FIG. 5 illustrates the relationship between critical current density, in the superconductor $j_c$, and the magnetic field applied perpendicular to the NbC/Cu composite wires.

Although NbC may be considered a low-field superconductor of limited practical usefulness and the above single-core wires were of rather low critical current density, multifilamentary wires of 7 and 49 filaments, with filament size down to 1 mil (0.025 mm) and below, have been fabricated using NbC powder. FIGS. 3 and 4 show cross-sections of such multifilamentary wires. These wires exhibited critical current densities, $j_c$, well in excess of the best literature data for NbC. FIG. 5 illustrates critical current densities of the NbC core, $j_c$'s, vs. the intensity of the magnetic field applied perpendicular to the wire axis for three comparably sized composite wires fabricated by two different methods. The first is a single-core swaged and drawn composite of the previous example. The second is a similar single-core composite fabricated by a hydrostatic extrusion process, and the third is a 7 filament composite made by the hydrostatic extrusion process. Clearly, both hydrostatic extrusion and the presence of many filaments improve the critical current densities.

Figure 6:
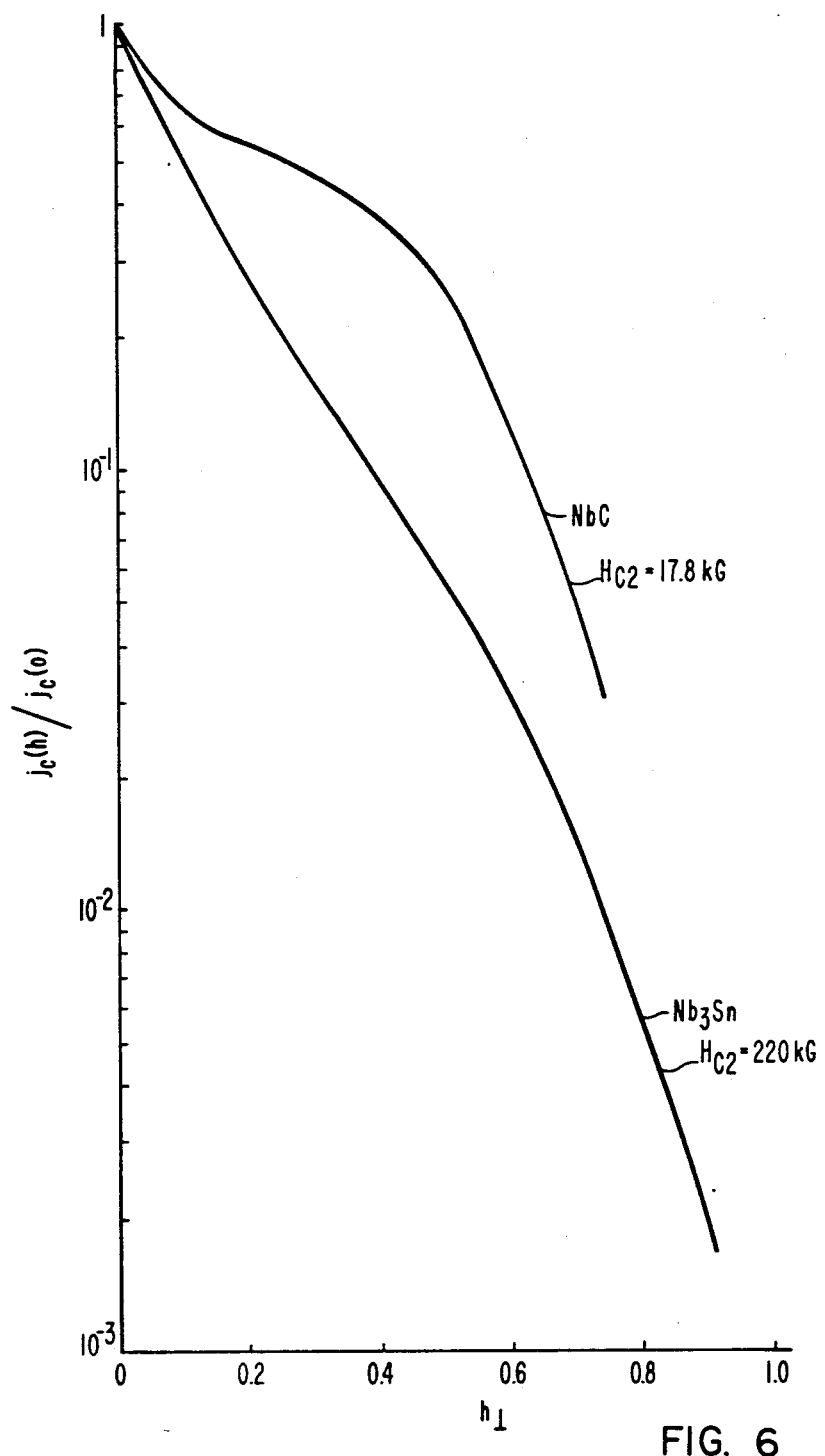
FIG. 6 illustrates in reduced variables the relationship between critical current density and magnetic field strength of the NbC/Cu in comparison to a diffusion-reacted Nb$_3$Sn composite of the prior art.

While NbC has a low upper critical field, $H_{c2} \simeq 17$ to 18 kG, the field dependence of critical current density $j_c$, can be compared to that of practical (high field) superconductors by using reduced coordinates of $h = H/H_{c2}$ and $j = j_c(h)/j_c(O)$. Using these reduced coordinates, FIG. 6 illustrates that the coupling between powder particles and the flux pinning (on voids) are strong enough to result in a field dependence superior to the best Nb$_3$Sn and certainly characteristic of bulk superconductive behavior.

Figure 7:
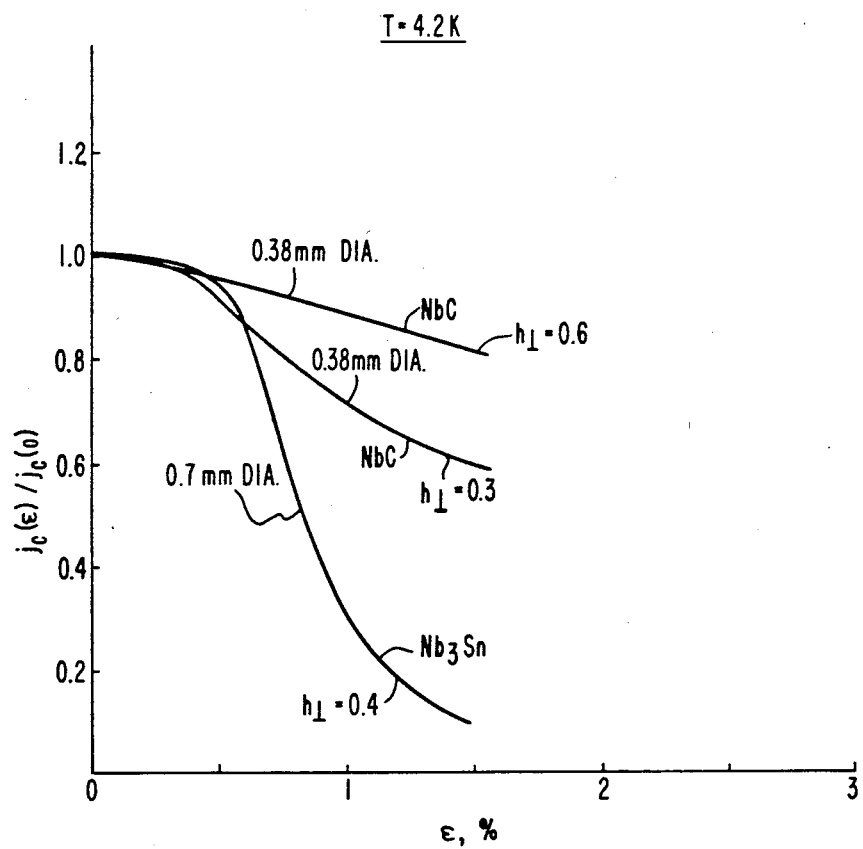
FIG. 7 illustrates the degradation of critical current density as a function of bending strain, for various NbC/Cu composite wires relative to the prior art Nb$_3$Sn composite wire.

In FIG. 7 the effect that bending strain, $\epsilon$, has on the degradation of the critical current density, $j_c$, for $h = 0.3$ and 0.6 is illustrated and compared to a typical multifilamentary Nb$_3$Sn wire strand at $h = 0.4$. It can be seen that in higher reduced fields the submicronparticle composite wire is degrading much less than the conventional composite. To the extent that the particle size, $\phi$, scales with the superconductor coherence length, $\xi_o$, as in the case of NbC($\phi/\xi_o \simeq 2$), the submicron-particle multifilament composite made of other, higher $T_c$, and $H_{c2}$ materials will also work.

Having thus described and exemplified the preferred embodiments with a certain degree of particularity, it is manifest that many changes can be made within the details of construction, arrangement and fabrication of the components and their uses without departing from the spirit and scope of this invention. Therefore, it is to be understood that the invention is not limited to the embodiments set forth herein for purposes of exemplification, but is to be limited only by the scope of the attached claims, including the full range of equivalents to which each element thereof is entitled.

We claim:

1. A method of making a ductile superconducting composite wire from a brittle superconducting compound, said method comprising:
    a. encapsulating a submicron-particle superconducting powder is a ductile conducting metal tube; and
    b. fabricating a wire from said tube without sintering or reaction annealing said fabricated wire, whereby the superconducting material in the fabricated wire remain as submicron particles.

2. A method of claim 1 further comprising:
    a. repeating said encapsulating thereby producing a plurality of said tubes; and
    b. fabricating a multifilamentary wire from said plurality of tubes.

3. A method of claim 1 or 2 further comprising the step of collecting said submicron-particle superconducting powder in a protective atmosphere before encapsulating said powder in said tube in said protective atmosphere.

4. A method of claims 1 or 2 wherein said fabricating a wire from said tube is by extrusion, hydrostatic extrusion, swaging, drawing, rolling, hammering, or combinations thereof.

5. A method of claims 1 or 2 wherein said encapsulating metal is selected from a group consisting of Cu, Al, Nb, Ta, Ag, Au, and mixtures thereof.

6. A method of claims 1 or 2 wherein said superconducting powder is selected from a group consisting of $Nb_3Sn$, $Nb_3Al$, $Nb_3Ga$, $Nb_3Ge$, $V_3Si$, $V_3Ga$, their pseudobinaries such as $Nb_3(Al, Ge)$, $Nb(N, C)$, NbC, and Chevrel phases such as $PbMo_6S_8$.

7. A method of claims 1 or 2 wherein said submicron-particle superconducting powder comprises particle sizes less than 1000 Angstroms.

8. A method of claims 1 or 2 wherein said submicron-particle superconducting powder comprises particle sizes of about 100 Angstroms.

9. A method of claims 1 or 2 wherein said metal is Cu and said superconducting powder is NbC.

10. A method of claims 1 or 2 wherein said superconducting composite wire is not sintered or reaction annealed.

11. A method of claims 1 or 2 wherein said submicron-particle superconducting powder is either coated with a layer of lubricant or mixed with a lubricant powder of comparable or smaller particle size.

* * * * *